(12) United States Patent
Jeong et al.

(10) Patent No.: US 12,543,535 B2
(45) Date of Patent: Feb. 3, 2026

(54) CHUCK ASSEMBLY, FABRICATION SYSTEM THEREWITH, AND METHOD OF FABRICATING SEMICONDUCTOR DEVICE USING THE SAME

(71) Applicant: Samsung Electronics Co., Ltd., Suwon-si (KR)

(72) Inventors: Seongha Jeong, Hwaseong-si (KR); Kyung-Sun Kim, Suwon-si (KR); Dongwan Kim, Suwon-si (KR); Donghyeon Na, Hwaseong-si (KR); Dougyong Sung, Seoul (KR); Myeongsoo Shin, Seoul (KR); Ungyo Jung, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 528 days.

(21) Appl. No.: 17/833,438

(22) Filed: Jun. 6, 2022

(65) Prior Publication Data

US 2023/0145476 A1     May 11, 2023

(30) Foreign Application Priority Data

Nov. 9, 2021    (KR) .......................... 10-2021-0153151

(51) Int. Cl.
| | | |
|---|---|---|
| *C23C 16/40* | (2006.01) | |
| *C23C 16/458* | (2006.01) | |
| *H01L 21/683* | (2006.01) | |

(52) U.S. Cl.
CPC ...... *H01L 21/6833* (2013.01); *C23C 16/4585* (2013.01); *C23C 16/4586* (2013.01)

(58) Field of Classification Search
CPC ........... H01L 21/6833; H01L 21/67103; H01L 21/67109; H01L 21/6831; H01L 21/68735; H01L 21/68757; C23C 16/4585; C23C 16/4586; B23Q 3/15; H01J 37/32642; H01J 37/32715; H02N 13/00
USPC .......................... 269/1; 279/1; 118/728, 500; 156/345.51; 361/234, 233; 414/941
See application file for complete search history.

(56) References Cited

U.S. PATENT DOCUMENTS

| | | | |
|---|---|---|---|
| 6,733,624 B2 * | 5/2004 | Koshiishi | H01L 24/90 118/500 |
| 6,841,943 B2 | 1/2005 | Vahedi et al. | |
| 6,896,765 B2 | 5/2005 | Steger | |
| 7,244,311 B2 | 7/2007 | Fischer | |
| 7,244,336 B2 | 7/2007 | Fischer et al. | |
| 8,387,562 B2 | 3/2013 | Kikuchi et al. | |
| (Continued) | | | |

FOREIGN PATENT DOCUMENTS

| | | |
|---|---|---|
| JP | 2007-258500 A | 10/2007 |
| JP | 2010-028073 A | 2/2010 |
| (Continued) | | |

*Primary Examiner* — Rudy Zervigon
(74) *Attorney, Agent, or Firm* — Harnss, Dickey & Pierce, P.L.C

(57) ABSTRACT

A chuck assembly includes a chuck base including a lower base and an upper base that is on the lower base, a ceramic plate on the upper base, an isolator ring enclosing an outer sidewall of the lower base, a focus ring on an edge portion of the lower base and the isolator ring, the focus ring enclosing an outer sidewall of the upper base, and a pad that is between the edge portion of the lower base and the focus ring. The pad may contain a nonmetal conductive material.

16 Claims, 4 Drawing Sheets

(56) References Cited

U.S. PATENT DOCUMENTS

| | | |
|---|---|---|
| 10,128,089 B2 | 11/2018 | Kobayashi et al. |
| 10,622,196 B2 | 4/2020 | Nagayama et al. |
| 10,784,089 B2 | 9/2020 | Rogers et al. |
| 2002/0029745 A1* | 3/2002 | Nagaiwa ............ H01L 21/67103 118/728 |
| 2005/0133164 A1* | 6/2005 | Fischer ............. H01L 21/68735 156/345.48 |
| 2012/0281334 A1* | 11/2012 | Sasaki ............... H01J 37/32642 361/234 |
| 2015/0053348 A1* | 2/2015 | Nagayama .......... H01J 37/3266 118/723 R |
| 2015/0114567 A1* | 4/2015 | Nagayama ........ H01J 37/32091 156/345.52 |
| 2019/0006155 A1 | 1/2019 | Zhao et al. |
| 2019/0172688 A1* | 6/2019 | Ueda ................. H01L 21/68735 |
| 2020/0251313 A1* | 8/2020 | Rogers ............... H01L 21/6833 |

FOREIGN PATENT DOCUMENTS

| | | |
|---|---|---|
| JP | 2012-146743 A | 8/2012 |
| KR | 10-00538863 B1 | 12/2005 |
| KR | 10-2015-0048081 A | 5/2015 |

* cited by examiner

CHUCK ASSEMBLY, FABRICATION SYSTEM THEREWITH, AND METHOD OF FABRICATING SEMICONDUCTOR DEVICE USING THE SAME

CROSS-REFERENCE TO RELATED APPLICATION

This U.S. non-provisional patent application claims priority under 35 U.S.C. § 119 to Korean Patent Application No. 10-2021-0153151, filed on Nov. 9, 2021, in the Korean Intellectual Property Office, the entire contents of which are hereby incorporated by reference.

BACKGROUND

The present inventive concepts relate to systems and methods of fabricating a semiconductor device, and in particular, to a chuck assembly, on which a substrate is loaded, a fabrication system including the same, and a method of fabricating a semiconductor device using the same.

In general, semiconductor devices are fabricated using a plurality of unit processes, such as a thin film deposition process, a photolithography process, and an etching process. The etching process includes a dry etching process, in which a plasma reaction is used. An etching system for the dry etching process includes a chuck assembly, on which a substrate is loaded. The chuck assembly may be configured to fasten a substrate thereon using an electrostatic force.

SUMMARY

Some example embodiments of the inventive concepts provides a chuck assembly, which is configured to suppress a plasma arcing phenomenon, and a semiconductor device fabrication system including the same.

According to some example embodiments of the inventive concepts, a chuck assembly may include a chuck base including a lower base and an upper base that is on the lower base, a ceramic plate on the upper base, an isolator ring enclosing an outer sidewall of the lower base, a focus ring on an edge portion of the lower base and the isolator ring, the focus ring enclosing an outer sidewall of the upper base, and a pad that is between the edge portion of the lower base and the focus ring. The pad may contain a nonmetal conductive material.

According to some example embodiments of the inventive concepts, a semiconductor device fabrication system may include a chamber, a shower head in an upper portion of the chamber, and a chuck assembly that is in a lower portion of the chamber to contain a substrate. The chuck assembly may include a chuck base including a lower base and an upper base that is on the lower base, a ceramic plate on the upper base, an isolator ring enclosing an outer sidewall of the lower base, a focus ring on an edge portion of the lower base and the isolator ring, the focus ring enclosing an outer sidewall of the upper base, and a pad that is between the edge portion of the lower base and the focus ring. The pad may contain a nonmetal conductive material.

According to some example embodiments of the inventive concepts, a method of fabricating a semiconductor device may include placing a substrate on a chuck assembly, providing a reaction gas on the substrate, and supplying a radio frequency power to produce a plasma on the substrate. The chuck assembly may include a chuck base including a lower base and an upper base that is on the lower base, a ceramic plate on the upper base, an isolator ring enclosing an outer sidewall of the lower base, a focus ring on an edge portion of the lower base and the isolator ring, the focus ring enclosing an outer sidewall of the upper base, and a pad between the edge portion of the lower base and the focus ring. The pad may contain a nonmetal conductive material.

DETAILED DESCRIPTION

Figure 1:
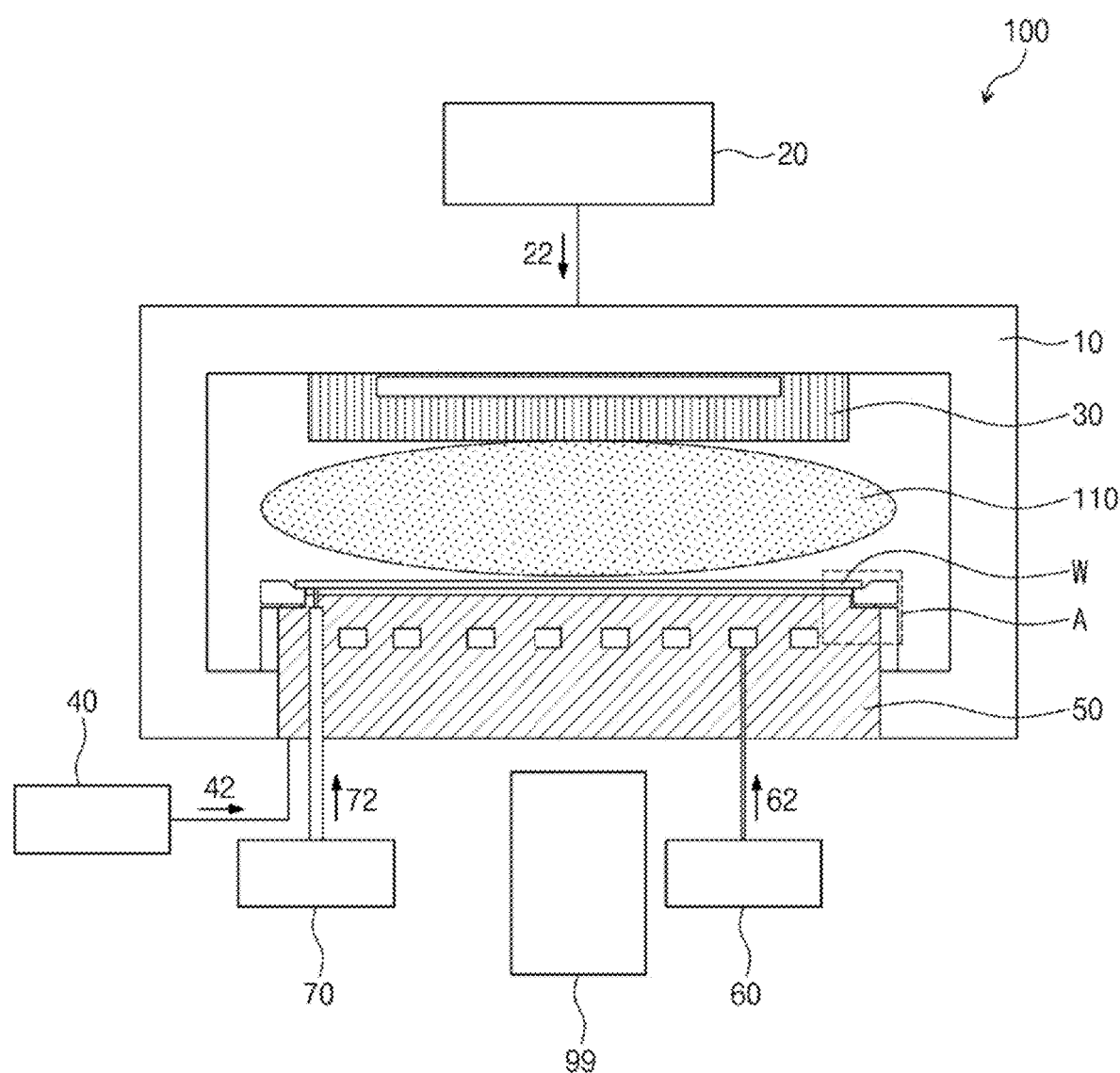
FIG. 1 is a diagram schematically illustrating a semiconductor device fabrication system according to some example embodiments of the inventive concepts.

Hereinafter, some example embodiments of the present inventive concepts will be described in detail so that a person skilled in the art would understand the same. The inventive concepts may, however, be embodied in many different forms and is not construed as limited to the example embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present such that the element and the other element are isolated from direct contact with each other by one or more interposing spaces and/or structures. In contrast, when an element is referred to as being "directly on" another element, there are no intervening elements present such that the element and the other element are in direct contact with each other. As described herein, an element that is "on" another element may be above, beneath, and/or horizontally adjacent to the other element.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%).

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

It will be understood that elements and/or properties thereof described herein as being the "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

While the term "same," "equal" or "identical" may be used in description of some example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes. When ranges are specified, the range includes all values therebetween such as increments of 0.1%.

As described herein, elements that are described to be in contact with other elements may be understood to be in "direct" contact with the other elements.

FIG. 1 schematically illustrates a semiconductor device fabrication system 100 according to some example embodiments of the inventive concepts.

Referring to FIG. 1, the semiconductor device fabrication system 100 may be a capacitively-coupled plasma (CCP) etching system. In some example embodiments, the semiconductor device fabrication system 100 may be an inductively-coupled plasma (ICP) etching system or a microwave plasma etching system, but the inventive concepts are not limited to this example. In some example embodiments, the semiconductor device fabrication system 100 may include a chamber 10, a gas supply portion 20 (also referred to herein as a gas supply system, gas supply, gas supply device, gas source, or the like), a shower head 30, a power supply portion 40 (also referred to herein as a power supply system, power supply, power supply device, power source, or the like), a chuck assembly 50, a cooling water supply portion 60 (also referred to herein as a cooling water supply system, cooling water supply, cooling water supply device, cooling water source, or the like), and a coolant supply portion 70 (also referred to herein as a coolant supply system, coolant supply, coolant supply device, coolant source, or the like).

The chamber 10 may be configured to form a space that is isolated from the outside. A substrate W may be placed in the chamber 10. The substrate W may be or include a silicon wafer, but the inventive concepts are not limited to this example. Although not shown, the chamber 10 may have a slit door or slit valve. The substrate W may be placed in the chamber 10 through the slit door or the slit valve. In some example embodiments, the substrate W may be placed in the chamber 10 through the chuck assembly 50. During the step of placing the substrate W in the chamber 10, the chuck assembly 50 may be moved in a downward or upward direction, in a region below the chamber 10. But the inventive concepts are not limited to this example.

The gas supply portion 20 may be configured to supply a reaction gas 22 into the chamber 10. The reaction gas 22 may be used to etch the substrate W or a thin film (not shown) on the substrate W. In some example embodiments, the reaction gas 22 may include $CH_3$ or $SF_6$. In some example embodiments, the reaction gas 22 may include ammonia ($NH_3$) or silane ($SiH_4$). In some example embodiments, the reaction gas 22 may be used to deposit a thin film on the substrate W, but the inventive concepts are not limited to these examples.

The shower head 30 may be provided in an upper portion of the chamber 10. The shower head 30 may be connected to the gas supply portion 20. The shower head 30 may be configured to supply the reaction gas 22 toward the substrate W. Although not shown, the shower head 30 may be connected to the power supply portion 40, but the inventive concepts are not limited to this example.

The power supply portion 40 may be provided outside the chamber 10. The power supply portion 40 may be connected to the chuck assembly 50. The power supply portion 40 may provide a radio frequency power 42 to the chuck assembly 50. The radio frequency power 42 may be used to produce and concentrate plasma 110 on the substrate W. The radio frequency power 42 may have a frequency of about 400 kHz, about 2 MHz, and/or about 60 MHz. In addition, the radio frequency power 42 may have a pulsing frequency of about 1 kHz to about 10 kHz. In some example embodiments, the power supply portion 40 may be connected to the shower head 30, but the inventive concepts are not limited to this example.

The chuck assembly 50 may be provided in a lower portion of the chamber 10. The chuck assembly 50 may be configured to load the substrate W thereon or to contain the substrate W therein. The substrate W may be provided on a center region of the chuck assembly 50. As an example, the chuck assembly 50 may be an electrostatic chuck assembly. The chuck assembly 50 may be configured to fasten the substrate W using an electrostatic voltage supplied from an electrostatic voltage supply portion (not shown). The electrostatic voltage may be a DC voltage.

The cooling water supply portion 60 may be connected to the chuck assembly 50. The cooling water supply portion 60 may be configured to supply a cooling water 62 into the chuck assembly 50. The chuck assembly 50 may be cooled by the cooling water 62 circulating in the chuck assembly 50. For example, the cooling water 62 may be maintained to a room temperature (e.g., of about 20° C.). The cooling water 62 may include de-ionized water, but the inventive concepts are not limited to this example.

The coolant supply portion 70 may be connected to the chuck assembly 50. The coolant supply portion 70 may be configured to supply a coolant 72 into the chuck assembly 50. The coolant 72 may pass through the chuck assembly 50 and then may be supplied to a bottom surface of the substrate W. In the case where the substrate W is heated by the plasma 110, the coolant 72 may lower the temperature of the substrate W or may prevent the substrate W from being overheated. In addition, by using the coolant 72, it may be possible to prevent or suppress an etching process from being greatly affected by temperature of the substrate W and thereby to improve etching uniformity of the substrate W, but the inventive concepts are not limited to this example. As an example, the coolant 72 may be a gaseous coolant. For example, the coolant 72 may include helium (He) gas.

The semiconductor device fabrication system 100 may include a control device 99 that is configured to control the operation of any or all elements of the semiconductor device fabrication system 100, for example based on generating and transmitting control signals to any or all of the chamber 10, the gas supply portion 20, the shower head 30, the power supply portion 40, the chuck assembly 50, a cooling water supply portion 60, and/or the coolant supply portion 70. The control device 99 may be communicatively coupled to any of the chamber 10, the gas supply portion 20, the shower head 30, the power supply portion 40, the chuck assembly 50, a cooling water supply portion 60, and/or the coolant supply portion 70, any combination thereof, or the like. The control device 99 may be configured to (based on, for example, a processor thereof executing a program of instructions stored at a memory thereof) cause one or more operations of any of the methods of the example embodiments to be performed based on generating one or more command signals and transmitting the command signals to one or more of the chamber 10, the gas supply portion 20, the shower head 30, the power supply portion 40, the chuck assembly 50, a cooling water supply portion 60, the coolant supply portion 70, or the like of the communicatively coupled semiconductor device fabrication system 100 to cause the semiconductor device fabrication system 100 to cause the one or more operations to be performed based on operation of the one or more of the chamber 10, the gas supply portion 20, the shower head 30, the power supply portion 40, the chuck assembly 50, a cooling water supply portion 60, the coolant supply portion 70, or the like in response to the one or more command signals.

As described herein, any devices, systems, blocks, modules, units, controllers, circuits, apparatus, and/or portions thereof according to any of some example embodiments (including, without limitation, any of the example embodiments of the control device 99, any portion thereof, or the like) may include, may be included in, and/or may be implemented by one or more instances of processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a graphics processing unit (GPU), an application processor (AP), a digital signal processor (DSP), a microcomputer, a field programmable gate array (FPGA), and programmable logic unit, a microprocessor, application-specific integrated circuit (ASIC), a neural network processing unit (NPU), an Electronic Control Unit (ECU), an Image Signal Processor (ISP), and the like. In some example embodiments, the processing circuitry may include a non-transitory computer readable storage device (e.g., a memory), for example a solid state drive (SSD), storing a program of instructions, and a processor (e.g., CPU) configured to execute the program of instructions to implement the functionality and/or methods performed by some or all of any devices, systems, blocks, modules, units, controllers, circuits, apparatuses, and/or portions thereof according to any of some example embodiments, and/or any portions thereof, including for example some or all operations of any of the methods shown in FIG. 7.

Figure 2:
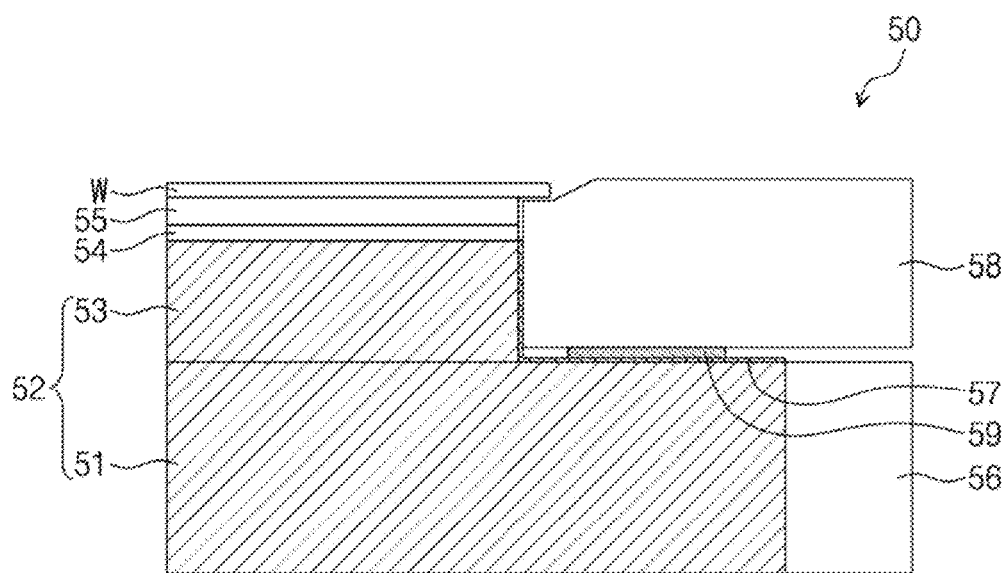
FIG. 2 is a sectional view illustrating a portion (e.g., Region A of FIG. 1) of a chuck assembly according to some example embodiments of the inventive concepts.

FIG. 2 is a sectional view illustrating a portion (e.g., Region A of FIG. 1) of a chuck assembly according to some example embodiments of the inventive concepts. FIG. 2 illustrates a portion (e.g., 'A' of FIG. 1) of the chuck assembly 50 shown in FIG. 1 according to some example embodiments of the inventive concepts.

Referring to FIGS. 1 and 2, the chuck assembly 50 may include a chuck base 52, a first adhesive layer 54 (also referred to as a bonder layer), a ceramic plate 55, an isolator ring 56, an insulation coating layer 57, a focus ring 58, and a pad 59.

The chuck base 52 may support the first adhesive layer 54, the ceramic plate 55, the isolator ring 56, the insulation coating layer 57, and the focus ring 58. For example, the chuck base 52 may be formed of or include at least one of aluminum or aluminum alloys. In some example embodiments, the chuck base 52 may include a lower base 51 and an upper base 53.

The lower base 51 may be combined with a lower portion of the chamber 10. The lower base 51 may be in contact with an inner sidewall of the lower portion of the chamber 10. The lower base 51 may be wider than the upper base 53, when viewed in a plan view. The lower base 51 may have a cooling water hole. The cooling water hole may be connected to the cooling water supply portion 60 of FIG. 1. The cooling water 62 in the cooling water hole may be used to cool the lower base 51 and the upper base 53. An edge portion of the lower base 51 may not be veiled with the upper base 53 and may be exposed to the outside of the chuck base 52. The edge portion of the lower base 51 may support the insulation coating layer 57, the focus ring 58, and the pad 59.

The upper base 53 may be provided on a center region of the lower base 51. The upper base 53 may be narrower than the lower base 51, when viewed in a plan view. The upper base 53 may be used to support the first adhesive layer 54 and the ceramic plate 55.

The first adhesive layer 54 may be provided on the upper base 53. The first adhesive layer 54 may be used to fix the ceramic plate 55 to the upper base 53. For example, the first adhesive layer 54 may be formed of or include epoxy, but the inventive concepts are not limited to this example.

The ceramic plate 55 may be provided on the upper base 53. The substrate W may be electrically separated from the upper base 53 by the ceramic plate 55. For example, the ceramic plate 55 may be formed of or include aluminum oxide ($Al_2O_3$). Although not shown, heater electrodes, ground electrodes, and chuck electrodes may be provided in the ceramic plate 55, but the inventive concepts are not limited to this example.

The isolator ring 56 may be provided on an outer sidewall (e.g., an outer circumference surface) of the lower base 51. The isolator ring 56 may be provided to enclose the outer sidewall of the lower base 51. The isolator ring 56 may protect the outer sidewall of the lower base 51 from the plasma 110. The isolator ring 56 may be formed of or include aluminum oxide ($Al_2O_3$).

The insulation coating layer 57 may be provided the edge portion of the lower base 51 and an outer sidewall of the upper base 53. For example, the insulation coating layer 57 may be formed of or include at least one of aluminum oxide ($Al_2O_3$), aluminum nitride (AlN), yttrium oxide ($Y_2O_3$), or anodized aluminum, but the inventive concepts are not limited to this example. The insulation coating layer 57 may have a thickness of about 0.05 mm to about 5 mm and a breakdown voltage of about 1 kV/mm or higher.

The focus ring 58 may be provided (e.g., located) on the insulation coating layer 57. The focus ring 58 may be provided on the isolator ring 56. The focus ring may enclose an outer sidewall of the upper base 53. The focus ring 58 may be provided below an edge portion of the substrate W. In addition, the focus ring 58 may be provided around the substrate W to face an outer sidewall of the substrate W. The plasma 110 may be concentrated in a region on the substrate W by the focus ring 58. For example, the focus ring 58 may be formed of or include silicon carbide (SiC) or crystalline silicon.

The pad 59 may be provided on the edge portion of the lower base 51. The pad 59 may be provided between the insulation coating layer 57 and the focus ring 58. An impedance between the edge portion of the lower base 51 and the focus ring 58 to the radio frequency power 42 may be reduced by the pad 59. Furthermore, the pad 59 may reduce the impedance between the edge portion of the lower base 51 and the plasma 110. Accordingly, it may be possible to reduce a potential difference between the substrate W and the focus ring 58 and thereby to reduce an arcing phenomenon of the plasma 110. For example, the pad 59 may have thickness of about 0.1 mm to about 10 mm and a planar area of about 100 mm$^2$ to about 100000 mm$^2$. More specifically, the pad 59 may have a thickness of about 0.5 mm to 0.7 mm, a width of about 10 mm to 12 mm, an inner radius of about 306 mm, and an outer radius of about 326 mm. The pad 59 may have a volume resistance of about $10^{10}\Omega m$, a breakdown voltage of about 1 kV/mm, and a heat transfer coefficient of about 0.1 W/m-K to about 100 W/m-K.

Figure 3:
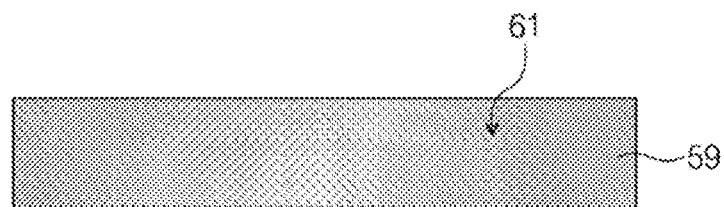
FIG. 3 is a sectional view illustrating an example of a pad of FIG. 2 according to some example embodiments of the inventive concepts.

FIG. 3 is a sectional view illustrating an example of the pad 59 of FIG. 2 according to some example embodiments of the inventive concepts.

Referring to FIG. 3, the pad 59 may be formed of or include an insulating or dielectric material containing a nonmetal conductive material 61. For example, the pad 59 may be formed of or include at least one of aluminum oxide ($Al_2O_3$), aluminum nitride (AlN), or yttrium oxide ($Y_2O_3$). An impedance of the pad 59 to the radio frequency power 42 may be reduced by the nonmetal conductive material 61. If the pad 59 includes a metal, the metal may serve as a source of the arcing phenomenon. By contrast, according to some example embodiments of the inventive concepts, by using the nonmetal conductive material 61, it may be possible to suppress the arcing phenomenon. For example, the nonmetal conductive material 61 may include carbon nanotube, graphene, graphite, or fullerene. The nonmetal conductive material 61 may have a mass concentration of about 5% to about 95%. The higher the mass concentration of the nonmetal conductive material 61, the lower the impedance of the pad 59.

Figure 4:
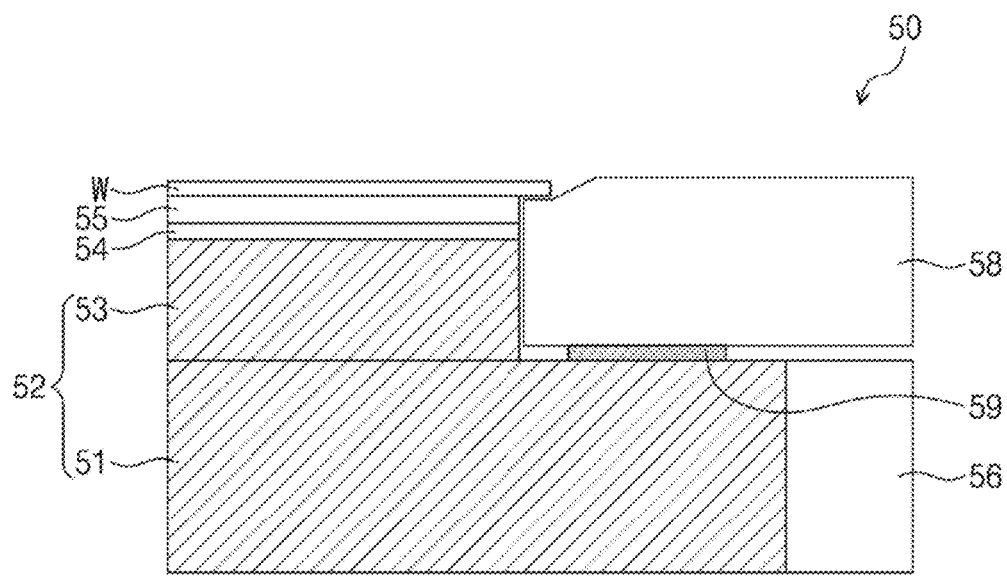
FIG. 4 is a sectional view illustrating a portion (e.g., Region A of FIG. 1) of a chuck assembly according to some example embodiments of the inventive concepts.

FIG. 4 is a sectional view illustrating a portion (e.g., Region A of FIG. 1) of a chuck assembly according to some example embodiments of the inventive concepts. FIG. 4 illustrates a portion (e.g., 'A' of FIG. 1) of the chuck assembly 50 shown in FIG. 1 according to some example embodiments of the inventive concepts.

Referring to FIG. 4, the pad 59 and the lower base 51 may be electrically connected to each other, without the insulation coating layer 57 of FIG. 2. The pad 59 may be in contact with the lower base 51.

The focus ring 58 and the pad 59 may have an impedance of about 276.7 SI to the radio frequency power 42 of about 400 kHz. The focus ring 58 and the pad 59 may have an impedance of about 57.8Ω to the radio frequency power 42 of about 2 MHz. The focus ring 58 and the pad 59 may have an impedance of about 11.8Ω to the radio frequency power 42 of about 60 MHz.

The lower base 51, the upper base 53, the first adhesive layer 54, the ceramic plate 55, and the isolator ring 56 may be configured to have the same features as those of FIG. 2.

Figure 5:
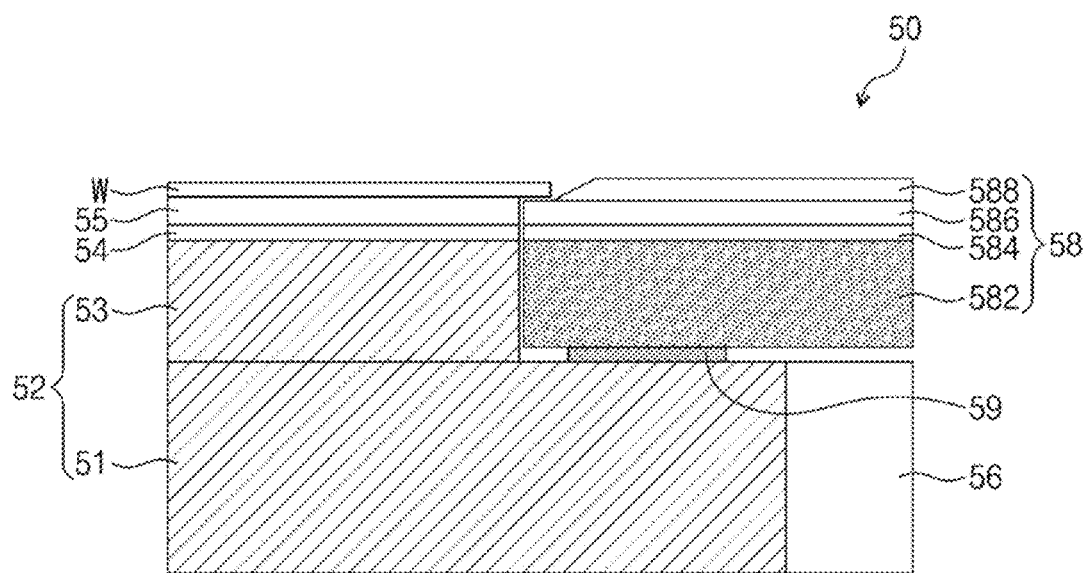
FIG. 5 is a sectional view illustrating a portion (e.g., Region A of FIG. 1) of a chuck assembly according to some example embodiments of the inventive concepts.

FIG. 5 is a sectional view illustrating a portion (e.g., Region A of FIG. 1) of a chuck assembly according to some example embodiments of the inventive concepts. FIG. 4 illustrates a portion (e.g., 'A' of FIG. 1) of the chuck assembly 50 shown in FIG. 1, including for example at least of a portion of the focus ring 58 of FIG. 4, according to some example embodiments of the inventive concepts.

Referring to FIG. 5, the focus ring 58 may include layers, which are similar to the upper base 53, the first adhesive layer 54, the ceramic plate 55, and the substrate W. In some example embodiments, the focus ring 58 may include a lower layer 582, a second adhesive layer 584, a ceramic layer 586, and an upper layer 588.

The lower layer 582 may be provided on the outer sidewall of the upper base 53. The lower layer 582 may be provided on the pad 59. The lower layer 582 may be electrically connected to the pad 59. A top surface of the lower layer 582 may be coplanar with a top surface of the upper base 53. An impedance of the focus ring 58 to the radio frequency power 42 may be reduced by the lower layer 582. The lower layer 582 may be a conductive layer. For example, the lower layer 582 may be formed of or include an aluminum oxide layer containing a nonmetal conductive material. The nonmetal conductive material contained in the lower layer 582 may be referred to herein as a "separate" nonmetal conductive material which may be the same nonmetal conductive material as a nonmetal conductive material that is contained in the pad 59 or a different nonmetal conductive material than the nonmetal conductive material that is contained in the pad 59. The nonmetal conductive material may include carbon nanotube, graphene, graphite, or fullerene. In some example embodiments, the lower layer 582 may include an aluminum nitride layer or an yttrium oxide layer containing the nonmetal conductive material.

The second adhesive layer 584 may be provided on the lower layer 582. The second adhesive layer 584 may fasten the ceramic layer 586 to the lower layer 582. The second adhesive layer 584 may be provided on an outer sidewall of the first adhesive layer 54. The second adhesive layer 584 may enclose an outer sidewall of the first adhesive layer 54. A top surface of the second adhesive layer 584 may be coplanar with a top surface of the first adhesive layer 54.

The ceramic layer 586 may be provided on the second adhesive layer 584. The ceramic layer 586 may be provided on an outer sidewall of the ceramic plate 55. A top surface of the ceramic layer 586 may be coplanar with a top surface of the ceramic plate 55. The ceramic layer 586 may be formed of or include at least one of aluminum oxide ($Al_2O_3$) or yttrium oxide ($Y_2O_3$).

The upper layer 588 may be provided on the ceramic layer 586. The upper layer 588 may enclose the outer sidewall of the substrate W. The upper layer 588 may enclose the substrate W on the ceramic plate 55. The upper layer 588 may be formed of or include, for example, silicon or silicon carbide. A potential difference between the lower base 51 and the focus ring 58 may be equal to a potential difference between the upper base 53 and the substrate W.

In the case where a potential difference of the substrate W and the focus ring 58 to the chuck base 52 is increased, an arcing phenomenon of the plasma 110 may occur more easily. The lower layer 582, the second adhesive layer 584, the ceramic layer 586, and the upper layer 588 may be configured to reduce the potential difference of the substrate W and the focus ring 58 to the chuck base 52, and thus, it may be possible to reduce or minimize the arcing phenomenon.

Figure 6:
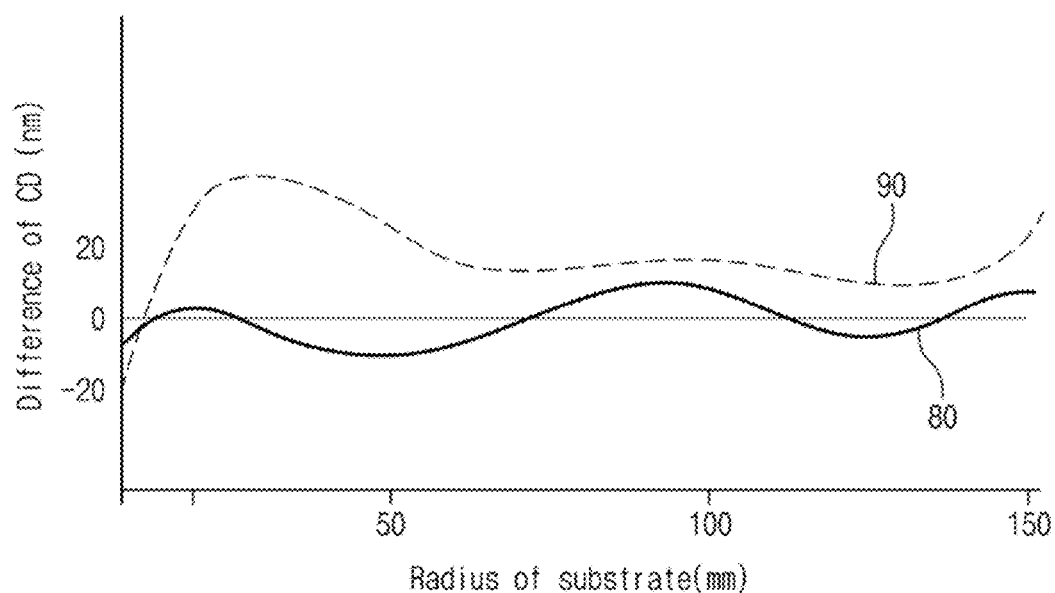
FIG. 6 is a graph showing a variation in critical dimension versus a radius of a substrate according to some example embodiments of the inventive concepts.

FIG. 6 is a graph showing a variation in critical dimension versus a radius of a substrate according to some example embodiments of the inventive concepts. FIG. 6 shows a variation in critical dimension (CD) versus a radius of a substrate according to some example embodiments of the inventive concepts. In FIG. 6, the curve 80 is a result obtained from a substrate processed using the chuck assembly of FIG. 1 or the semiconductor device fabrication system 100 according to some example embodiments of the inventive concepts, and the curve 90 is a result obtained from a substrate processed using a conventional chuck assembly.

Referring to FIG. 6, a CD variation may be smaller in the curve 80 than the curve 90. This shows that, in the case where the semiconductor device fabrication system 100 is used, it is possible to improve a CD difference. The CD difference may be a skew critical dimension.

Hereinafter, a method of fabricating a semiconductor device using the semiconductor device fabrication system 100 described above will be described in more detail.

Figure 7:
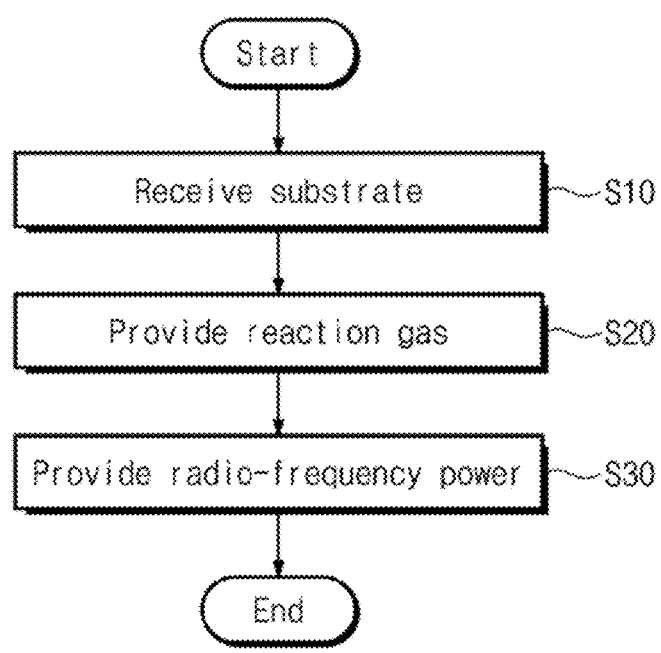
FIG. 7 is a flow chart illustrating a method of fabricating a semiconductor device, according to some example embodiments of the inventive concepts.

FIG. 7 illustrates a method of fabricating a semiconductor device, according to some example embodiments of the inventive concepts. The method shown in FIG. 7 may be implemented by any of the example embodiments of a semiconductor device fabrication system 100, for example based on a processor of control device 99 executing a program of instructions stored at a memory of the control device 99 to generate and transmit control signals to cause one or more portions of the semiconductor device fabrication system 100 to perform one or more of the operations of the method shown in FIG. 7.

Referring to FIGS. 1 and 7, the chuck assembly 50 may load the substrate W thereon or may contain the substrate W therein (in S10). The substrate W may be provided on the chuck assembly 50. The chuck assembly 50 may fasten the substrate W to the ceramic plate 55 using an electrostatic voltage.

Next, the gas supply portion 20 and the shower head 30 may supply the reaction gas 22 to a region on the substrate W (in S20). The reaction gas 22 may include an etching gas (e.g., $CH_3$ or $SF_6$).

Referring to FIGS. 1, 4, and 7, the power supply portion 40 may supply the radio frequency power 42, which is used to produce the plasma 110 on the substrate W (in S30). The radio frequency power 42 may have a frequency of about 400 kHz, about 2 MHz, and/or about 60 MHz. The focus ring 58 and the pad 59 of the chuck assembly 50 may reduce impedance to the radio frequency power 42 and may reduce the arcing phenomenon of the plasma 110. The focus ring 58 and the pad 59 may have an impedance of about 276.7Ω to the radio frequency power 42 of about 400 kHz. The focus ring 58 and the pad 59 may have an impedance of about 57.8Ω to the radio frequency power 42 of about 2 MHz. The focus ring 58 and the pad 59 may have an impedance of about 11.8Ω to the radio frequency power 42 of about 60 MHz.

According to some example embodiments of the inventive concepts, a chuck assembly may include a pad, which is disposed between an edge portion of a lower base and a focus ring and contains a nonmetal conductive material, and in this case, it may be possible to suppress a plasma arcing phenomenon.

While example embodiments of the inventive concepts have been particularly shown and described, it will be understood by one of ordinary skill in the art that variations in form and detail may be made therein without departing from the spirit and scope of the attached claims.

What is claimed is:

1. A chuck assembly, comprising:
    a chuck base including a lower base and an upper base that is on the lower base;
    a ceramic plate on the upper base;
    an isolator ring enclosing an outer sidewall of the lower base;
    a focus ring on an edge portion of the lower base and the isolator ring, the focus ring enclosing an outer sidewall of the upper base; and
    a pad that is between the edge portion of the lower base and the focus ring,
    wherein the focus ring includes
        a lower layer,
        a ceramic layer on the lower layer, and
        an upper layer on the ceramic layer, the upper layer enclosing a substrate on the ceramic plate,
    wherein the pad contains a first electrically conductive nonmetal material and at least one material selected from the group consisting of aluminum oxide ($Al_2O_3$), aluminum nitride (AlN), and yttrium oxide ($Y_2O_3$),
    wherein the lower layer contains a second electrically conductive nonmetal material, and wherein each of the first electrically conductive nonmetal material and the second electrically conductive nonmetal material includes at least one material selected from the group consisting of carbon nanotube, graphene, and fullerene.

2. The chuck assembly of claim 1, wherein the pad connects the focus ring to the edge portion of the lower base.

3. The chuck assembly of claim 1, wherein the pad has a thickness of 0.5 mm to 0.7 mm and a width of 10 mm to 12 mm.

4. The chuck assembly of claim 1, further comprising an insulation coating layer that is
between the edge portion of the lower base and the pad, and
between an inner sidewall of the focus ring and the outer sidewall of the upper base.

5. The chuck assembly of claim 1, further comprising a first adhesive layer that is between the upper base and the ceramic plate.

6. The chuck assembly of claim 5, wherein the focus ring further comprises a second adhesive layer, wherein the second adhesive layer is between the lower layer and the ceramic layer, the second adhesive layer enclosing an outer sidewall of the first adhesive layer.

7. A semiconductor device fabrication system, comprising:
a chamber;
a shower head in an upper portion of the chamber; and
a chuck assembly in a lower portion of the chamber, the chuck assembly configured to contain a substrate,
wherein the chuck assembly includes
a chuck base including a lower base and an upper base that is on the lower base,
a ceramic plate on the upper base,
an isolator ring enclosing an outer sidewall of the lower base,
a focus ring on an edge portion of the lower base and the isolator ring such that the focus ring encloses an outer sidewall of the upper base, and
a pad that is between the edge portion of the lower base and the focus ring,
wherein the focus ring includes
a lower layer,
a ceramic layer on the lower layer, and
an upper layer on the ceramic layer, the upper layer enclosing the substrate on the ceramic plate,
wherein the pad contains a first electrically conductive nonmetal material and at least one material selected from the group consisting of aluminum oxide ($Al_2O_3$), aluminum nitride (AlN), and yttrium oxide ($Y_2O_3$),
wherein the lower layer contains a second electrically conductive nonmetal material, and
wherein each of the first electrically conductive nonmetal material and the second electrically conductive nonmetal material includes at least one material selected from the group consisting of carbon nanotube, graphene, and fullerene.

8. The semiconductor device fabrication system of claim 7, further comprising a power supply, which is connected to the chuck base and is configured to supply a radio frequency power to the chuck base.

9. The semiconductor device fabrication system of claim 8, wherein the radio frequency power has at least one of a frequency of 400 kHz, a frequency of 2 MHZ, or a frequency of 60 MHz.

10. The semiconductor device fabrication system of claim 7, further comprising a cooling water supply which is configured to supply a cooling water into the chuck assembly.

11. The semiconductor device fabrication system of claim 9, further comprising a coolant supply which is configured to supply a coolant into the chuck assembly.

12. A method of fabricating a semiconductor device, the method comprising:
placing a substrate on a chuck assembly;
providing a reaction gas on the substrate; and
supplying a radio frequency power to produce a plasma on the substrate,
wherein the chuck assembly includes
a chuck base including a lower base and an upper base that is on the lower base;
a ceramic plate on the upper base;
an isolator ring enclosing an outer sidewall of the lower base;
a focus ring on an edge portion of the lower base and the isolator ring, the focus ring enclosing an outer sidewall of the upper base; and
a pad that is between the edge portion of the lower base and the focus ring,
wherein the focus ring includes
a lower layer,
a ceramic layer on the lower layer, and
an upper layer on the ceramic layer, the upper layer enclosing the substrate on the ceramic plate,
wherein the pad contains a first electrically conductive nonmetal material and at least one material selected from the group consisting of aluminum oxide ($Al_2O_3$), aluminum nitride (AlN), and yttrium oxide ($Y_2O_3$),
wherein the lower layer contains a second electrically conductive nonmetal material, and
wherein each of the first electrically conductive nonmetal material and the second electrically conductive nonmetal material includes at least one material selected from the group consisting of carbon nanotube, graphene, and fullerene.

13. The method of claim 12, wherein the radio frequency power has at least one of a frequency of 400 kHz, a frequency of 2 MHz, or a frequency of 60 MHz.

14. The method of claim 13, wherein the focus ring and the pad have an impedance of 276.7Ω to the radio frequency power, the radio frequency power having the frequency of 400 kHz.

15. The method of claim 13, wherein the focus ring and the pad have an impedance of 57.8Ω to the radio frequency power, the radio frequency power having the frequency of 2 MHz.

16. The method of claim 13, wherein the focus ring and the pad have an impedance of 11.8Ω to the radio frequency power, the radio frequency power having the frequency of 60 MHz.

* * * * *